US010809299B2

(12) United States Patent
Jochum et al.

(10) Patent No.: US 10,809,299 B2
(45) Date of Patent: Oct. 20, 2020

(54) TESTING DEVICE AND METHOD FOR TESTING A CONTROL UNIT OF A SWITCHING DEVICE OF A SWITCHGEAR INSTALLATION

(71) Applicant: OMICRON ELECTRONICS GMBH, Klaus (AT)

(72) Inventors: Michael Jochum, Altach (AT); Stephan Geiger, Weiler (AT); Rainer Kueng, Raggal (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 155 days.

(21) Appl. No.: 16/077,958

(22) PCT Filed: Feb. 8, 2017

(86) PCT No.: PCT/EP2017/052718
§ 371 (c)(1),
(2) Date: Aug. 14, 2018

(87) PCT Pub. No.: WO2017/140547
PCT Pub. Date: Aug. 24, 2017

(65) Prior Publication Data
US 2019/0049516 A1    Feb. 14, 2019

(30) Foreign Application Priority Data

Feb. 15, 2016 (AT) .............................. A 50094/2016

(51) Int. Cl.
*G01R 31/327* (2006.01)
*H02H 3/04* (2006.01)

(52) U.S. Cl.
CPC ..... *G01R 31/3272* (2013.01); *G01R 31/3275* (2013.01); *H02H 3/044* (2013.01)

(58) Field of Classification Search
CPC ............ G01R 31/3272; G01R 31/3275; G01R 31/303; G01R 31/3274; H02H 3/044; H01H 50/002; H01H 47/22
See application file for complete search history.

(56) References Cited

U.S. PATENT DOCUMENTS 4,712,058 A    12/1987 Branson
4,870,532 A *   9/1989 Beatty, Jr. .............. H02H 3/044
                                                       361/93.7

(Continued)

FOREIGN PATENT DOCUMENTS

| DE | 102008034109 | 2/2010 |
|----|--------------|--------|
| EP | 2 310 919    | 4/2011 |
| GB | 2 273 278    | 1/2011 |

OTHER PUBLICATIONS

PCT Search Report issued in PCT/EP2017/052718.
Austrian Search Report issued in A 50094/2016.

*Primary Examiner* — Christopher P McAndrew
*Assistant Examiner* — Zannatul Ferdous
(74) *Attorney, Agent, or Firm* — Greenblum & Bernstein, P.L.C.

(57) ABSTRACT

A testing device for testing a control unit of a switching device of an electrical switchgear installation. The testing device has a signal input, and to which a controlled current sink is provided, which is connected to the signal input. The controlled current sink shunts an input current from the signal input in order to provide a dynamically adjustable input impedance. A method for testing a control unit of a switching device of a switchgear installation, includes the testing device having a signal input, to which an input voltage may be applied. In the testing device, a controlled current sink shuts an input current from the signal input and thus provides a dynamically adjustable input impedance.

6 Claims, 2 Drawing Sheets

(56) References Cited

U.S. PATENT DOCUMENTS

Figure 2:
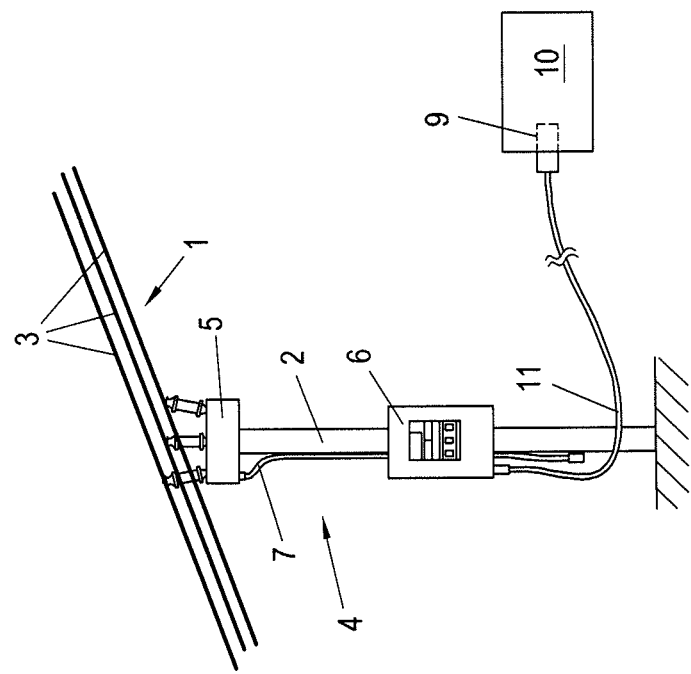

| | | | |
|---|---|---|---|
| 7,259,565 B2 * | 8/2007 | Diercks | G01R 31/327 324/415 |
| 2008/0012625 A1 * | 1/2008 | Feng | G11C 5/147 327/530 |
| 2011/0194217 A1 * | 8/2011 | Davis | H02H 3/044 361/18 |
| 2011/0133763 A1 | 9/2011 | Schulte | |
| 2014/0210484 A1 * | 7/2014 | Beck | H02H 3/044 324/509 |
| 2014/0312909 A1 * | 10/2014 | Alley | G01R 31/3275 324/415 |

* cited by examiner (State of the Art)

TESTING DEVICE AND METHOD FOR TESTING A CONTROL UNIT OF A SWITCHING DEVICE OF A SWITCHGEAR INSTALLATION

The present invention refers to a testing device and to a method for testing a control unit of a switching device of a switchgear installation, wherein the testing device has a signal input. The invention also refers to the use of the testing device for testing a control unit of a switching device of a switchgear installation.

Frequently, devices for testing control units of electrical switching devices are required. In particular in the field of electrical protection systems and electrical energy supply, the testing of the operation of switching device and their respective control units is important and often even prescribed. For instance, in electrical medium voltage grids, switching devices mounted on poles are often provided with electromagnetic actuators, and are connected through control connections with the control units. Usually, a testing device is used which has to simulate the switching device. To this end, the switching device and the control connection are separated from the control unit and in their stead a testing device is connected through an adapter cable to the control unit, in order to test its operation. The testing device has to subsequently generate corresponding electrical signals, which cause the control unit to perform determined reactions. The reactions are detected and evaluated by the testing device.

Control units also have the task to briefly output a positive voltage on the coil of the actuator and thus open the switching device. In order to close the switching device, a negative voltage is output through the same or another control line. Typically, direct voltages between 12 and 250V are used. The duration of the voltage impulses is typically in the range from 10 ms to 100 ms and depends on the form of the switching device. In order to enable a switching of the switching device, the switching device, i.e. in the first place the connected coil of the magnetic actuator, has often be initially recognized by the control unit, in order, for example, to recognize a defect control connection or to ensure that the switching device is connected. This recognition occurs through short pulses output by the control unit, wherein the pulses have obviously to be so short, that the switching device does not cause switching action. By measuring the reflowing current the connected load (thus, in the first place, the resistance of the coil) is deduced. In order to determine the state of the actuator, i.e. whether the switching device is actuated or not, in some control unit it may be usual, that the impedance of the magnetic actuator is measured continuously or at intervals, since the impedance of the switching device depends on the state of the actuator.

Adapter cables are normally required for connecting these control lines of the control unit to the measurement input of a testing device. These adapter cables frequently contain an additional electronics or an additional electrical connection. In general, in the adapter cable, resistors are used to simulate the impedance of the coil of the magnetic actuator and thus to suggest a connected switching device to the control unit. Moreover, in the adapter cables, devices are required which separate the positive and negative voltages on the control lines and which convert them to positive voltages and forward separately (thus over separate lines) to the testing device. These positive voltages may thus be applied to the testing device at two different binary signal inputs with two respective pins, whereupon the testing device may test the operation of the control unit.

The currently known solution thus requires additional components in order to enable the testing of the control unit. The production of adapter cables, which contain these components thus becomes more complex, costly and prone to errors. Furthermore different adapter cables having different electrical properties have to be used, if switching devices with different electrical properties have to be tested. Moreover a plurality of binary signal inputs of the testing device have to be provided, thus making the cabling itself more complex and prone to error.

The object of the present invention is thus to provide, based on above said state of the art, an improved functional testing of the switching device by means of a testing device.

This object is achieved in that in the testing device a controlled current sink is provided, which is connected with the signal input, wherein the current sink defines an input current at the signal input. Moreover dynamically adjustable input impedance may thus be achieved.

Since the impedance of the switching device may be simulated, according to the invention, dynamically by the input impedance of the testing device, there is no need for different adapter cables having different electronics for simulating the impedance of different switching devices. The manufacture of adapter cables is thus less costly and simpler. Moreover the risk of faults in the components in the adapter cable is reduced to a minimum.

Moreover, even switching devices, whose impedance depends on the switching state (trip or close), may be simulated by the testing device. In this case, as soon as a control signal is transmitted from the control unit to the testing device, the control unit is recognized, as usual, by the testing device, and the current of the current sink is adapted in such a way that the desired input impedance is provided in combination with the applied input voltage. Notoriously, the input impedance is obtained as the ratio of the input voltage to the input current. The signal input of the testing device is thus correspondingly configured, in order to simulate the load in the form of the coil of the power switch. Thus the required input impedances may be set and dynamically varied for simulating the coil impedance depending on the switch status. The desired load may be individually set, so that various control units may be tested. A modification of a component of the group formed by the control unit and the switching device, such as also a higher load to be simulated due to a firmware upgrade, may be easily adapted on the testing device without any hardware modification. For example, in order to provide a more sensitive coil recognition, the minimum required impedance of the switching device for a positive recognition of the connected switching device may be modified by means of a firmware upgrade. The control of the current sink may occur, for example, by means of a software setting in a logic unit inside the testing device.

Since the impedance of the switching device may be correctly reproduced by the testing device, all control units, which, as already said, want to investigate the functionality or the connection of the switching device through the impedance, may be tested by the testing device without any limitation. To this end, adapter cables without any integrated electronics may be used.

The inventive testing device may be used for testing a control unit of a switching device of a switchgear installation, in that the testing device reproduces the switching device. To this end, the signal input of the testing device is connected to the control unit and the control unit outputs an input signal to the signal input.

By using the testing device, the input impedance may be obtained via the input current and the input voltage.

The controlled current sink may advantageously be provided by means of a controlled control circuit, in which a controlled voltage source and a shunt are provided. The magnitude of the input current of the current sink may be set by a current flowing through the shunt, which is set in turn by the controlled voltage source.

The present invention is explained in the following with reference to FIGS. 1 to 3, which illustratively, schematically and non limitingly show advantageous embodiments of the invention. In particular FIG. 1 shows a part of an electrical power grid, FIG. 2 shows the power grid having a separated connection between the switching device and the control unit, which is connected to a testing device for testing, and FIG. 3 shows an inventive circuit diagram of the testing device.

Figure 1:
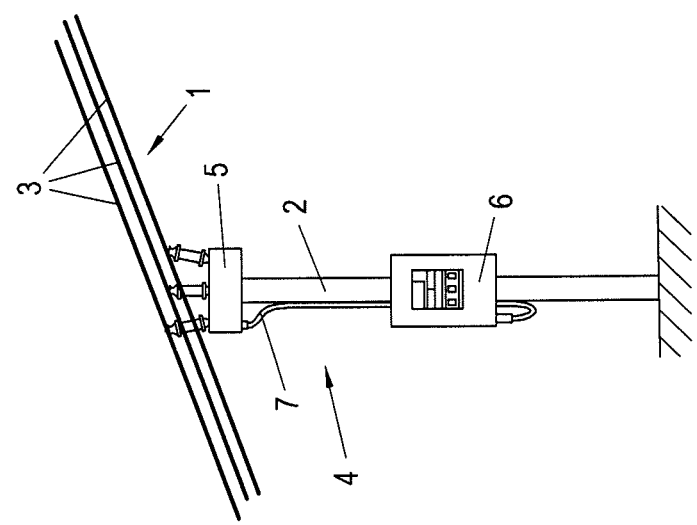

FIG. 1 shows a portion of an electrical power grid 1, which in the example shown is a three-phase overhead line, the lines 3 of which are conventionally stretched between poles 2. At pole 2 a safety device in the form of a switchgear installation 4 is provided, which is composed of a switching device 5 and a corresponding control unit 6. The switching device 5 is a recloser, as known, for example, or a power switch made of a magnetic actuator containing a coil. The switching device 5 is able to separate or connect at least one of the lines 3 by means of a switching action activated by the control unit 6. However, the invention is of course not limited to the use in an electrical power grid 1 in the form of an overhead line, but may be used in any installation for transmitting or distributing electrical energy with safety devices in the form of switchgear installation 4 having a switching device 5 and a corresponding control unit 6.

The switching device 5 is therefore connected via a control line 7 to the control unit 6. The control line 7 therefore normally comprises a number of control lines for transmitting control input variables and control output variables. Control output variables usually activate switching actions. In this case, on the side of the control unit 6, individually for each phase, often separate signal outputs for a trip signal (i.e. the opening of the switching device 5) and for a close signal (i.e. the closing of the switching device 5), but also solely a binary signal input for trip and close may be used. In particular control output variables are relevant to the invention. These control output variables are signals, which are generated by the control unit 6, such as a reaction to the control input variables, and through which the operation of the switching device 5 is controlled, such as by activating a switching measure. In this case, for example, the control unit 6 emits through the control lines 7 a positive pulse for the trip signal, or a negative pulse as a close signal, as control output variables.

Figure 3:
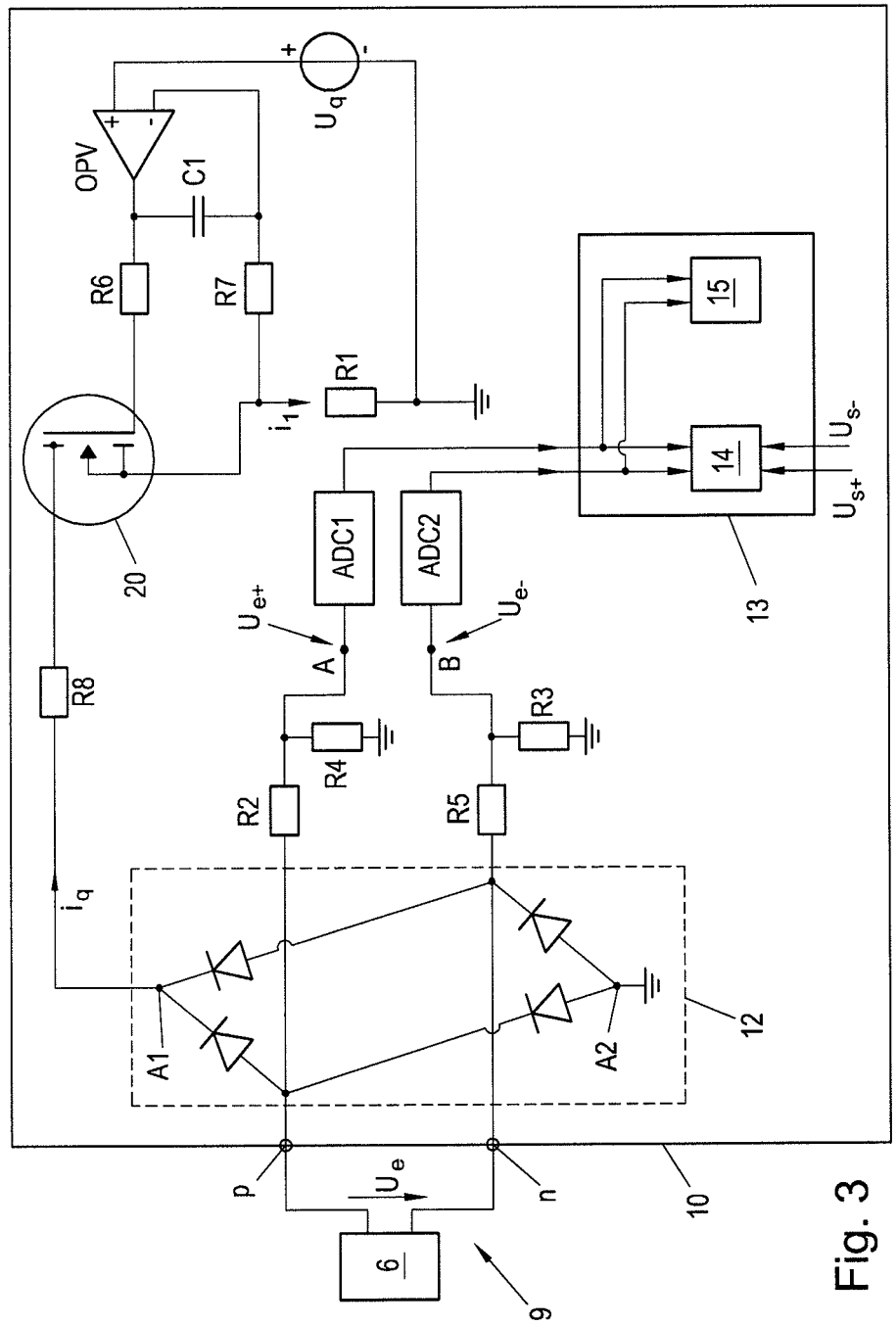

In order to test the switchgear installation 4, the control line 7 is disconnected between the switching device 5 and the control unit 6, as shown in FIG. 2. It would also be possible that the switching device 5, prior to testing, is not even connected to the control unit 6, such as during initial operation. Then the disconnecting of the control line 7 would be omitted. This happens frequently, since the control units 6 are frequently parametrized before installation and then functionally tested with the testing device 10, before these are brought into "the field" and installed. The control unit 6 is connected, for testing, with an adapter cable 11 to the testing device 10, which simulates the switching device 5, in order to test the correct operation and parametrization of the control unit 6 of the switching device 4. The adapter cable 11 is connected at one side to the signal output of the control unit 6 and on the other side to the signal output 9 of the testing device 10. Of course, also signal inputs of the control unit 6 and signal outputs of the testing device 10 may be contacted through the adapter cable 11. The testing device 10 is thus used for reproducing or simulating the switching device 5.

The testing device 10 receives, through the signal input, control output variables of the control unit 6, wherein testing devices 10 of the state of the art normally have binary signal inputs. The testing device 10 for reproducing the switching device 5 has thus to be configured for reproducing the signal inputs and signal outputs present in the switching device 5. It is not necessary that all signal inputs or outputs are used for testing. Usually, on the testing device 10, a signal input 9 for the trip signal and a signal input 9 for the close signal are respectively present, wherein each signal input 9 is in turn formed by two pins. To this end, in an electronics or circuitry provided in the adapter cable 11, the positive control signal (such as trip) or the negative control signal (such as close) is split and supplied to the respective binary signal input 9. This may occur as a positive or negative control signal, respectively, wherein for each signal input only one (positive or negative) switching threshold is anyway possible. To this end, the adapter cables 11 are usually provided with electronics or an electrical circuitry, thus causing a cost increase of production of the adapter cable 11 and also negatively impacting its robustness.

Moreover, the switching device 5 has an impedance, which also has to be considered in the electronics or electric circuitry of the adapter cable 11 i.e. in form of resistors. Thus for different switching devices 5 having different impedances different adapter cables 11 are required. This impedance is also dependent, for example when the switching device 5 is formed by a magnetic actuated actuator, from the switch position of the switching device 5. This means that when simulating the switching device 5 by means of the testing device 10 and the adapter cable 11 in operation, as soon as a switching process is activated by the control unit 6, also the variable impedance through the testing device 10 or the adapter cable 11 has to be considered.

According to the invention, the signal input 9 of the testing device 10 has only one positive pin p and a negative pin n and is configured in such a way that an input signal $U_e$ may be applied between the positive pin p and the negative pin n, as shown in FIG. 3. The testing device 10 also has a separation unit 12, which is connected to the positive pin p and the negative pin n and which is configured for separating a positive signal portion in the form of a positive track $U_{e+}$ and for outputting the same to a first pin A, or providing the same internally, and for separating a negative signal portion in the form of a negative track $U_{e-}$ and to output the same to a second pin B, and/or providing the same internally.

The inventive testing device 10 thus allows the use of only one signal input 9 both for a trip signal and a close signal. Since the signal input 9 is ternary, only a small number of inputs is required as compared to a binary embodiment of the signal inputs 9.

An inventive testing device 10 may reproduce the switching device 5 for testing a control unit 6 of a switching device 5 of a switchgear installation 4, wherein the signal input 9 of the testing device 10 is connected to the control unit 6, such as over an adapter cable 11, and wherein the control unit 6 outputs an input signal $U_e$ to the signal input 9.

Moreover, the testing device 10 may also have a logic unit 13, which is connected to the first pin A and the second pin B and which processes the positive track $U_{e+}$ and the negative track $U_{e-}$ independently from each other.

Moreover the testing device 10 may have a comparator unit 14, such as in the logic unit 13, which compares the positive track $U_{e+}$ to a predetermined or set positive threshold $U_{S+}$ and the negative track $U_{e-}$ to a predetermined or set negative threshold $U_{S-}$.

The testing device 10 may also have a detection unit 15, such as in the logic unit 13, which detects the positive and/or negative edge of positive track $U_{e+}$ and/or of negative track $U_{e-}$.

Particularly advantageous is the case, where the separation unit 12 is formed by a rectifier, wherein the first pin A is connected to a first input terminal of the rectifier and to the positive pin p and the second pin B is connected to the second input terminal of the rectifier and to the negative pin. In other words, the first input terminal of the rectifier, the positive pin p and the first pin A and the second input terminal of the rectifier, the negative pin and the second pin B coincide. The separation unit 12 provided as a rectifier implies a reduced use of circuits.

Moreover a first analog/digital converter ADC1 may be present, which is connected to the first pin A and digitalizes the positive track $U_{e+}$ and/or a second analog/digital converter ADC2, which is connected to the second pin B and digitalizes the negative track $U_{e-}$. This allows the digital processing of the positive track $U_{e+}$ and of the negative track $U_{e-}$ and a simple configuration of the comparator unit 14 and of the detection unit 15 in the form of software.

In FIG. 3, a possible embodiment of the invention is shown. At signal input 9, at positive pin p and negative pin n an input voltage $U_e$ is applied, which is supplied by the control unit 6 over the adapter cable 11. A separation unit 12 is connected, for example, in the form of a rectifier, to the positive pin p and the negative pin n. The positive pin p and the negative pin n are connected in this case to the input side of the rectifier.

The rectifier in the embodiment shown is a known bridge-type rectifier provided with diodes, wherein also other embodiments of the rectifier may be conceived.

By tapping the positive portion of the input voltage $U_e$ on the first pin A of the rectifier, a positive track $U_{e+}$ of the input voltage $U_e$ may be separated. By tapping the negative portion of the input voltage $U_e$ on the second pin B of the rectifier, a negative track $U_{e-}$ of the input voltage may be separated. In order to convert the positive track $U_{e+}$ and the negative track $U_{e-}$ into voltages, which may be processed by the first analog/digital converter ADC1 and by the second analog/digital converter ADC2, the positive track $U_{e+}$ and the negative track $U_{e-}$ are respectively converted by means of a voltage divider in the form of resistors R2 and R4, and R5 and R3, respectively, to a lower voltage value. The digitalized values of the positive track $U_{e+}$ and of the negative track $U_{e-}$ are supplied to a logic unit 13, which in this case contains a comparator unit 14, and are processed independently from each other. The comparator unit 14 compares the positive track $U_{e+}$ or the negative track $U_{e-}$ to a predetermined positive threshold $U_{S+}$ or a predetermined negative threshold $U_{S-}$. From this, a trip or close signal sent by the control unit 6 may be deduced. Digital filters may be provided in the logic unit 13. A huge advantage of the digital filter system are the filter parameters, which may be set during operation in a different way depending on requirements. It is of course also possible to place analog filters before the ADCs, however with the drawback of the fixed parameters and the additional circuitry.

The provision of the separation unit 12 in the form of a rectifier at the input has advantages related to the circuit, since the use of an unipolar voltage supply or ADC conversion is enabled and a controlled current source may be easily obtained by means of a MOSFET.

It would of course also be possible to provide a bipolar signal input 9 and then generate the positive track $U_{e+}$ and the negative track $U_{e-}$ digitally from the input voltage $U_e$. However, this solution has some drawbacks with respect to the previous embodiment: the production of the ADCs, in particular of their voltage supply is more complex and a voltage-controlled current source cannot be provided by means of only one MOSFET. On the contrary, a bipolar voltage-controlled current source would be required, which would imply much more complex circuitries. A possible embodiment would comprise, for example, a respective n-channel MOSFET and a p-channel MOSFET. This solution may thus only be provided in a costly and complex cable solution, since twice as many (binary) inputs and, as said, additional adjustable impedances are required.

The rectifier of FIG. 3 may also operate with highly resistive connected output terminals A1, A2, of the rectifier, thus almost in an idle state. A closed circuit is anyway required, in order for the rectifier to effectively operate and thus allow the separation of the positive and negative tracks.

However, in order to simulate the impedance of the switching device 5 by the testing device 10 in the form of a dynamically adjustable input impedance Z of the testing device 10, a controlled current sink 20 may be present in the testing device 10, wherein the current sink is connected to the signal input 9, wherein the controlled current sink 20 shunts an input current $i_q$ from the signal input 9.

In a particularly advantageous embodiment, the controlled current sink 20 is formed by a controlled control circuit, in which a controlled voltage source $U_q$ and a shunt R1, connected to a reference potential, such as mass, are provided. The magnitude of the input current $i_q$ of the controlled current sink 20 is set via a current flowing over the shunt R1, wherein the current $i_1$ is set by the controlled voltage source $U_q$ and approximately corresponds to the input current $i_q$.

In FIG. 3, the signal input 9 is connected via the separation unit 12, in this case the rectifier and the resistor R8, to the controlled current sink 20, such as an n-channel MOSFET. The MOSFET, as the controlled current sink 20, draws, through the drain input, from a first output of the rectifier, the input current $i_q$, which is set by the controlled voltage source $U_q$, the second output of the rectifier is at the reference potential (here, the mass). To this end, the controlled voltage source $U_q$ is connected to the non inverting input of an operational amplifier OPV. The inverting input of the operational amplifier OVP is connected through a resistor R7 to the first terminal of shunt R1, whereby the voltage of the controlled voltage source $U_q$ is set on shunt R1, since the second terminal of shunt $R_1$ as well as the negative output of the voltage source $U_q$ are connected to the reference potential (here, the mass). Thus a current $i_1$, which approximately corresponds to the input current $i_q$ drawn through the controlled current sink 20 flows over the shunt $R_1$. The first terminal of shunt R1 is connected to the source input S of MOSFET. Between the non inverting input of the operational amplifier OPV and the output of the operational amplifier a capacitor C1 is connected. Moreover the output of the operational amplifier OPV is connected through the resistor R6 to the gate of the MOSFET. Since the MOSFET preferably operates in the saturation region, the input current $i_q$, which corresponds to the drain current of the MOSFET, is set over the drain-source-voltage, i.e. further on over the controlled voltage source $U_q$.

The controlled current sink 20 may of course also be in the form of bipolar transistors, for example. Such a modification of the control however would cause a reduction of the dielectric strength.

The input protection resistor R8 has a positive temperature coefficient. In case of excessive input currents, the input protection resistor R8 acts as a reversible thermal protection, i.e. the value of the input resistor R8 increases with the input current $i_q$, whereby the current sink 20 is protected against overcurrents. The operational amplifier OPV is a proportional controller, wherein the input voltage $U_q$ present at the non inverting input is corrected at shunt R1. The proportional resistor R7 provides, in the ratio to R1, the proportional portion of the proportional controller formed by the operational amplifier circuit. The current thus set at the output of the operational amplifier OPV is obtained from the ratio of the input voltage $U_q$ at the non inverting input of the operational amplifier OPV to the resistance of the shunt R1. The capacitor C1 is used for stabilizing the controller, in that it reduces the amplification at higher frequencies. The gate resistor R6 is used for controlling the MOSFET.

An inventive testing device 10 may thus be used for adjusting the input impedance Z through the adjustable input current $i_q$ and the applied input voltage $U_e$.

To this end, the controlled current sink 20 or the controlled voltage source $U_q$ controlling the controlled current sink 20 may be controlled via software. Thus the input current $i_q$ shunted from the signal input 9 may be set, which provides the desired input impedance Z in combination with the input voltage $U_e$. The dynamically adjustable input impedance Z allows, on one hand, a simulation of various switching devices 5 with a testing device 10 without the need for different adapter cables 11 (except for different connectors, if needed). Moreover, an impedance of the switching device 5 depending on the switching status may be considered, since during operation/test of the testing device 10, the input impedance Z may be varied, as desired.

The invention claimed is:

1. A testing device structured and arranged for testing a control unit of a switching device of an electrical switchgear installation by simulating an impedance of the switching device, wherein the testing device has a signal input, wherein a controlled current sink is provided in the testing device, which is connected to the signal input, wherein the controlled current sink is configured to shunt an input current from the signal input in order to provide a dynamically adjustable input impedance that simulates the impedance of the switching device.

2. The testing device of claim 1, wherein the controlled current sink is part of a controlled control circuit, in which a controlled voltage source and a shunt are present, wherein a magnitude of the input current of the controlled current sink is set by a current flowing across the shunt, wherein the current flowing across the shunt is set by the controlled voltage source.

3. A method of using the testing device of claim 1, comprising:
    simulating, with the testing device, the switching device,
    connecting the signal input of the testing device to the control unit, and
    outputting, with the control unit, an input signal to the signal input.

4. The method of claim 3, further comprising obtaining through the input current and an input voltage the dynamically adjustable input impedance.

5. A method for testing a control unit of a switching device of a switchgear installation by simulating an impedance of the switching device, the method comprising:
    applying an input voltage to a signal input of the testing device,
    utilizing a controlled current sink to shunt an input current from the signal input in order to provide a dynamically adjustable input impedance that simulated the impedance of the switching device.

6. The method of claim 5, wherein the controlled current sink is part of a controlled control circuit, and further comprising utilizing a controlled voltage source to set a current over a shunt that controls a magnitude of the input current of the controlled current sink.

* * * * *